United States Patent
Song et al.

(10) Patent No.: US 10,910,442 B2
(45) Date of Patent: *Feb. 2, 2021

(54) DISPLAY DEVICE AND ELECTRICAL DEVICE USING THE SAME

(71) Applicant: Samsung Display Co., Ltd., Yongin-si (KR)

(72) Inventors: Seungyong Song, Yongin-si (KR); Chungsock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,062

(22) Filed: Dec. 26, 2018

(65) Prior Publication Data

US 2019/0131357 A1    May 2, 2019

Related U.S. Application Data

(63) Continuation of application No. 15/836,777, filed on Dec. 8, 2017, now Pat. No. 10,204,967, which is a
(Continued)

(30) Foreign Application Priority Data

Feb. 17, 2015 (KR) .................... 10-2015-0024238

(51) Int. Cl.
  *H01L 27/32* (2006.01)
  *H01L 51/52* (2006.01)
  *H01L 51/00* (2006.01)

(52) U.S. Cl.
  CPC ...... *H01L 27/3211* (2013.01); *H01L 51/0097* (2013.01); *H01L 51/5265* (2013.01); *H01L 2251/5338* (2013.01); *H01L 2251/558* (2013.01)

(58) Field of Classification Search
  CPC ............ H01L 51/5265; H01L 51/0097; H01L 27/3211; H01L 2251/5338; H01L 2251/558; G06F 1/1641; Y02E 10/549
  See application file for complete search history.

(56) References Cited

U.S. PATENT DOCUMENTS 7,453,201 B2   11/2008  Goden et al.
7,470,933 B2 * 12/2008  Lee ..................... H01L 27/3211
                                                          257/40
(Continued)

FOREIGN PATENT DOCUMENTS

CN      103137650 A      6/2013
CN      104425563 A      3/2015
(Continued)

*Primary Examiner* — Eric A. Ward
(74) *Attorney, Agent, or Firm* — Lewis Roca Rothgerber Christie LLP

(57) ABSTRACT

A display device includes: a substrate comprising a first region and a second region bent relative to the first region; a plurality of first pixels at the first region, each of the first pixels comprising a first light-emitting diode (LED), the first LED comprising a pixel electrode, an emission layer for emitting light of a first color, and a counter electrode; a plurality of second pixels at the second region, each of the second pixels comprising a second LED, the second LED comprising a pixel electrode, an emission layer configured to emit the first color, and a counter electrode; and an optical resonance layer at the second region corresponding to the second LED.

20 Claims, 11 Drawing Sheets

Related U.S. Application Data continuation of application No. 14/827,241, filed on Aug. 14, 2015, now Pat. No. 9,842,886.

(56) References Cited

U.S. PATENT DOCUMENTS

| | | |
|---|---|---|
| 7,663,715 B2 | 2/2010 | Jin et al. |
| 8,917,015 B2 | 12/2014 | Iwata |
| 9,013,094 B2 | 4/2015 | Chang et al. |
| D739,368 S | 9/2015 | Lee et al. |
| 9,454,930 B2 | 9/2016 | Oh et al. |
| 9,525,012 B2 | 12/2016 | Lim et al. |
| 9,570,527 B2 | 2/2017 | Namkung |
| 9,577,017 B2 | 2/2017 | Kim et al. |
| 9,842,886 B2 * | 12/2017 | Song .................. H01L 27/3211 |
| 9,859,340 B2 | 1/2018 | Kikuchi et al. |
| 10,204,967 B2 * | 2/2019 | Song .................. H01L 27/3211 |
| 2003/0044639 A1 | 3/2003 | Fukuda |
| 2003/0201974 A1 | 10/2003 | Yin |
| 2003/0203210 A1 | 10/2003 | Graff et al. |
| 2005/0065188 A1 | 3/2005 | Nakao et al. |
| 2012/0133275 A1 | 5/2012 | Lee et al. |
| 2012/0299033 A1 | 11/2012 | Goda |
| 2013/0321740 A1 * | 12/2013 | An ...................... H05K 5/0217 349/58 |
| 2014/0118271 A1 | 5/2014 | Lee et al. |
| 2014/0267091 A1 | 9/2014 | Kim |
| 2014/0267097 A1 | 9/2014 | Lee et al. |
| 2014/0312319 A1 | 10/2014 | Kim |
| 2014/0319483 A1 | 10/2014 | Moon et al. |
| 2015/0333295 A1 * | 11/2015 | Kim ................... H01L 51/5278 257/40 |

FOREIGN PATENT DOCUMENTS

| | | |
|---|---|---|
| JP | 2011-230332 A | 11/2011 |
| KR | 10-0747401 B1 | 8/2007 |
| KR | 10-2012-0057286 A | 6/2012 |
| KR | 30-0747401 | 6/2014 |

* cited by examiner

DISPLAY DEVICE AND ELECTRICAL DEVICE USING THE SAME

CROSS-REFERENCE TO RELATED APPLICATION

This application is a continuation of U.S. patent application Ser. No. 15/836,777, filed Dec. 8, 2017, which is a continuation of U.S. patent application Ser. No. 14/827,241, filed Aug. 14, 2015, now U.S. Pat. No. 9,842,886, which claims priority to and the benefit of Korean Patent Application No. 10-2015-0024238, filed Feb. 17, 2015, the entire content of both of which is incorporated herein by reference.

BACKGROUND

1. Field

Aspects of one or more embodiments of the present invention relate to a display device and an electrical device using the display device.

2. Description of the Related Art

Recently, in addition to the effort to provide electronic devices in a variety of configurations, research and development is underway for providing displays in various configurations to be mounted on electronic devices.

Organic light-emitting display devices, which are self-emission display devices, have attracted attention as next generation display devices in terms of being driven at a relatively low voltage without requiring a separate light source, being formed as relatively thin and lightweight devices, and having high-quality characteristics, such as wide viewing angles, high contrast ratios, and excellent response speed.

It is to be understood that this Background of the technology section is intended to provide useful background for understanding the technology and as such disclosed herein, the Background section may include ideas, concepts, or information that do not constitute prior art.

SUMMARY

One or more example embodiments of the present invention include a display device and an electrical device using the display device.

Additional aspects will be set forth in part in the description which follows and, in part, will be apparent from the description, or may be learned by practice of the presented embodiments.

According to some example embodiments of the present invention, a display device includes: a substrate comprising a first region and a second region bent relative to the first region; a plurality of first pixels at the first region, each of the first pixels comprising a first light-emitting diode (LED), the first LED comprising a pixel electrode, an emission layer for emitting light of a first color, and a counter electrode; a plurality of second pixels at the second region, each of the second pixels comprising a second LED, the second LED comprising a pixel electrode, an emission layer configured to emit the first color, and a counter electrode; and an optical resonance layer at the second region corresponding to the second LED.

The optical resonance layer may be between the pixel electrode of the second LED and the counter electrode of the second LED.

The counter electrode of the first LED may be integrally formed with the counter electrode of the second LED to cover the first region and the second region of the substrate.

Each of the first LED and the second LED may further include at least one functional layer between the pixel electrode and the counter electrode of each of the first LED and the second LED, and the at least one functional layer corresponding to the first LED may be integrally formed with the at least one functional layer corresponding to the second LED.

A first height from the pixel electrode of the first LED to the emission layer of the first LED may be smaller than a second height from the pixel electrode of the second LED to the emission layer of the second LED.

A thickness of the optical resonance layer may be equal to a difference between the first height and the second height.

Each of the first LED and the second LED may further include a first resonance auxiliary layer between the pixel electrode of each of the first LED and the second LED and the emission layer may be configured to emit light of the first color of each of the first LED and the second LED.

Each of the plurality of first pixels may further include a third LED configured to emit light of a second color, each of the plurality of second pixels may further include a fourth LED configured to emit light of the second color, and the optical resonance layer may be at the second region to correspond to the second LED and the fourth LED.

Each of the third LED and the fourth LED may further include a second resonance auxiliary layer between a pixel layer of each of the third and fourth LEDs and an emission layer configured to emit light of the second color of each of the third and fourth LEDs.

Each of the first LED and the second LED may further include the first resonance auxiliary layer between the pixel electrode of each of the first LED and the second LED and the emission layer may be configured to emit light of the first color of each of the first LED and the second LED, and a thickness of the first resonance auxiliary layer may be different from a thickness of the second resonance auxiliary layer.

Each of the plurality of first pixels may further include a fifth LED configured to emit light of a third color, each of the plurality of second pixels may further include a sixth LED configured to emit light of the third color, and the optical resonance layer may be at the second region to correspond to the second LED, the fourth LED, and the sixth LED.

The optical resonance layer may include at least one of a hole transport material, a hole injection material, an electron transport material, and an electron injection material.

A minor angle between the first region and the second region may be an obtuse angle.

The first region may have a polygonal shape having a plurality of edges, and the second region may be adjacent to at least one edge of the plurality of edges.

According to some example embodiments of the present invention, an electrical device includes: a main body; and a display panel at one side of the main body and configured to display an image through a screen that is bent around at least one folding portion, wherein the display panel includes: a substrate comprising a first region and a second region that are adjacent to each other relative to the folding portion, wherein the second region is bent relative to the first region; a plurality of first pixels at the first region; a plurality of second pixels at the second region; and an optical resonance layer at one region among the first region and the second region, wherein each of the plurality of first pixels and each of the plurality of second pixels comprise a plurality of light-emitting diodes (LEDs) that produce different colors.

Each of the plurality of first pixels and each of the plurality of second pixels may include a red LED, a green LED, and a blue LED, and the optical resonance layer may be at the second region to correspond to at least one of the red LED, the green LED, and the blue LED of the plurality of second pixels.

Each of the LEDs may include a pixel electrode that is patterned in correspondence to each of the LEDs, an emission layer at the pixel electrode, and a counter electrode at the emission layer, and the counter electrodes of the LEDs may be integrally formed to cover the emission layers of each of the plurality of LEDs.

Each of the plurality of LEDs may further include at least one functional layer between the pixel electrode and the counter electrode, and the at least one functional layers of the LEDs may be integrally formed and located at the first and second regions to correspond to all of the plurality of LEDs.

The optical resonance layer may include at least one of a hole transport material, a hole injection material, an electron transport material, and an electron injection material.

A first LED, which is one of the red LED, the green LED, and the blue LED of each of the plurality of first pixels, may have a first height from the pixel electrode of the first LED to the emission layer of the first LED, a second LED may be one of the red LED, the green LED, and the blue LED of each of the plurality of second pixels and may be configured to emit light of a same color with the first LED, may have a second height from the pixel electrode the second LED to the emission layer of the second LED, and the first height and the second height may be different from each other.

A thickness of the optical resonance layer may be equal to a difference between the first height and the second height.

The electrical device may further include a transparent protective substrate at one side of the screen in the display panel, and the transparent protective substrate may be bent in correspondence to the display panel.

The first region may have a polygonal shape having a plurality of edges and the second region may be adjacent to at least one edge of the plurality of edges.

Some aspects, characteristics, and features other than the description described above will be clarified by referring to drawings, claims, and detailed descriptions provided below.

BRIEF DESCRIPTION OF THE DRAWINGS

These and/or other aspects will become more apparent and more readily appreciated from the following description of the example embodiments, taken in conjunction with the accompanying drawings in which.

DETAILED DESCRIPTION

Figure 1:
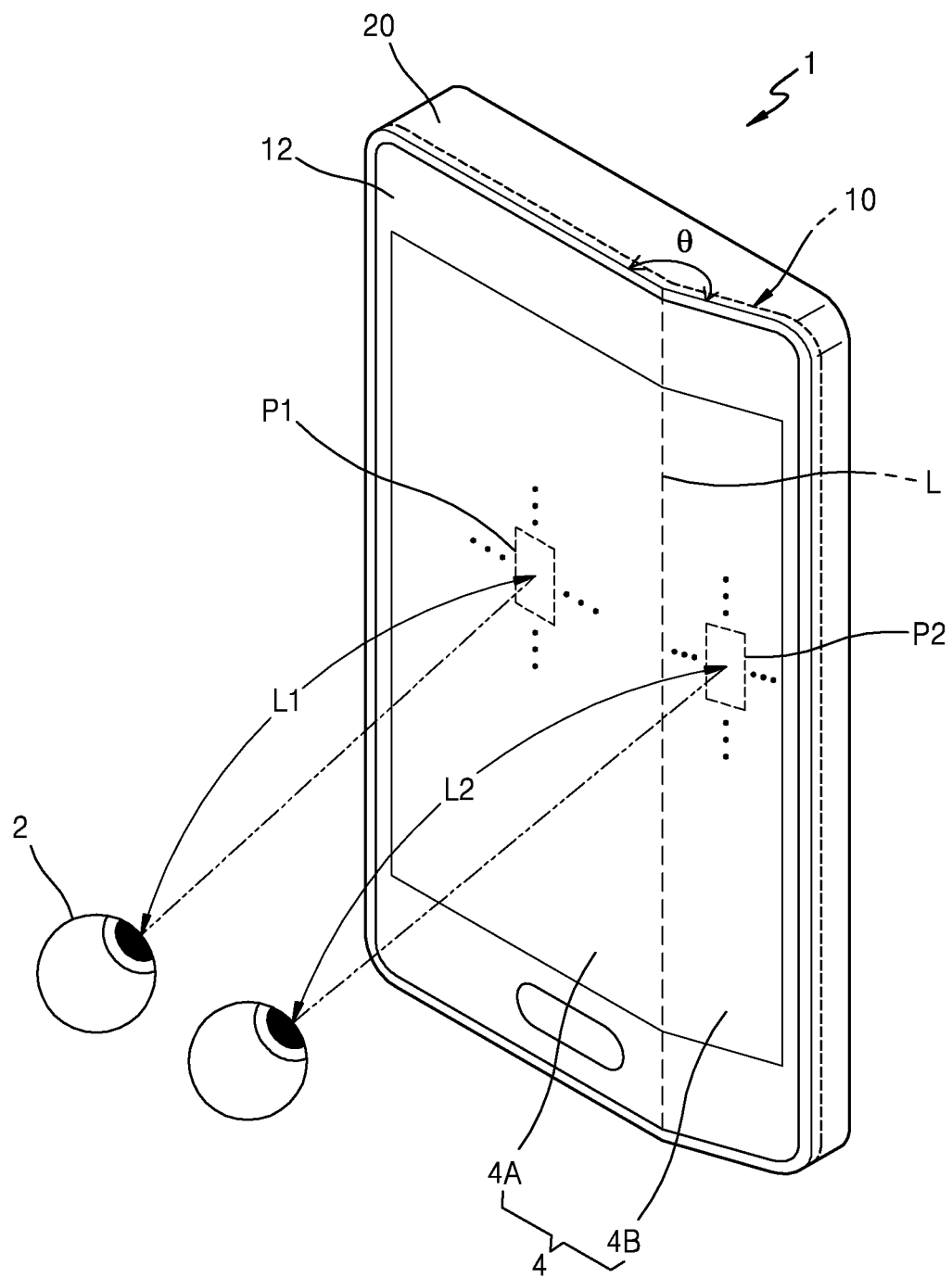
FIG. 1 is a schematic perspective view of an electrical device according to an example embodiment.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In drawings, like reference numerals refer to like elements throughout and overlapping descriptions shall not be repeated.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

When films, regions, or components are connected to each other, the films, the regions, or the components may not only be directly connected to each other, but may also be indirectly connected to each other as another film, another region, or another component is disposed therebetween.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

FIG. 1 is a schematic perspective view of electronic equipment or an electrical device according to an example embodiment.

Referring to FIG. 1, electronic equipment (or electrical device) 1 includes a main body or housing 20 and a display device 10 (e.g., a display panel), wherein the main body 20 includes at least one open surface and the display device 10 is positioned or arranged on the open surface of the main body 20. The electronic equipment 1 may be portable electronic equipment, such as a mobile phone and a tablet PC, but is not limited thereto. For example, any equipment (or device), such as small and medium-sized image advertising equipment or large-sized image advertising equipment, may be used as the electronic equipment 1 as long as the equipment is capable of providing an image.

The main body 20 includes at least one open surface, and the display device 10 may be positioned or arranged on the open surface of the main body 20. In addition, various components such as a battery, a communication terminal, etc., for driving or operating the display device 10 may be mounted inside the main body 20.

The display device 10 may provide (e.g., display) an image for a user 2 through a screen 4. The screen 4 may be bent relative to at least one folding portion L. For example, the screen 4 may include a first screen 4A and a second screen 4B that are positioned on both (e.g., opposite) sides relative to the folding portion L. The screen 4 may be bent such that a minor angle θ (e.g., a central angle) between the first screen 4A and the second screen 4B is an obtuse angle. In addition, the first screen 4A includes a plurality of first pixels P1 to provide an image, and the second screen 4B includes a plurality of second pixels P2 to provide an image.

Thus, the first screen 4A and the second screen 4B are bent relative to each other, and thus a first distance L1 between a user 2 and an image provided from the first screen 4A is different from a second distance L2 between a user 2 and an image provided from the second screen 4B. In an example embodiment, the first screen 4A, which is relatively large, is a main screen while the second screen 4B, which is relatively small, is a sub-screen. In this case, the second distance L2 may be longer than the first distance L1.

A transparent protective substrate 12 may be positioned on the screen 4 of the display device 10, thereby protecting the screen 4 having a plurality of the first pixels P1 and a plurality of the second pixels P2. The transparent protective substrate 12 may be formed of a transparent glass material, a transparent plastic material, or the like. The transparent protective substrate 12 may be also bent in accordance with the screen 4, which is an emission surface in the display device 10.

The first screen 4A and the second screen 4B may emit light in a perpendicular direction and an oblique direction with respect to an emission surface of each of the first screen 4A and the second screen 4B. As shown in FIG. 1, when the first screen 4A is positioned in parallel with the user 2 (e.g., both eyes of a user), light emitted in a perpendicular direction with respect to the emission surface of the first screen 4A may be mainly recognized or perceived by the user 2. Because the second screen 4B is bent relative to the first screen 4A, the second screen 4B is positioned obliquely to the user 2, and thus light emitted in an oblique direction with respect to the emission surface of the second screen 4B may not be mainly recognized or perceived by the user 2. Thus, although the first screen 4A and the second screen 4B provide an image of the same color, the color characteristics provided by each of the first screen 4A and the second screen 4B are recognized differently by the user according to the screen 4.

Figure 2:
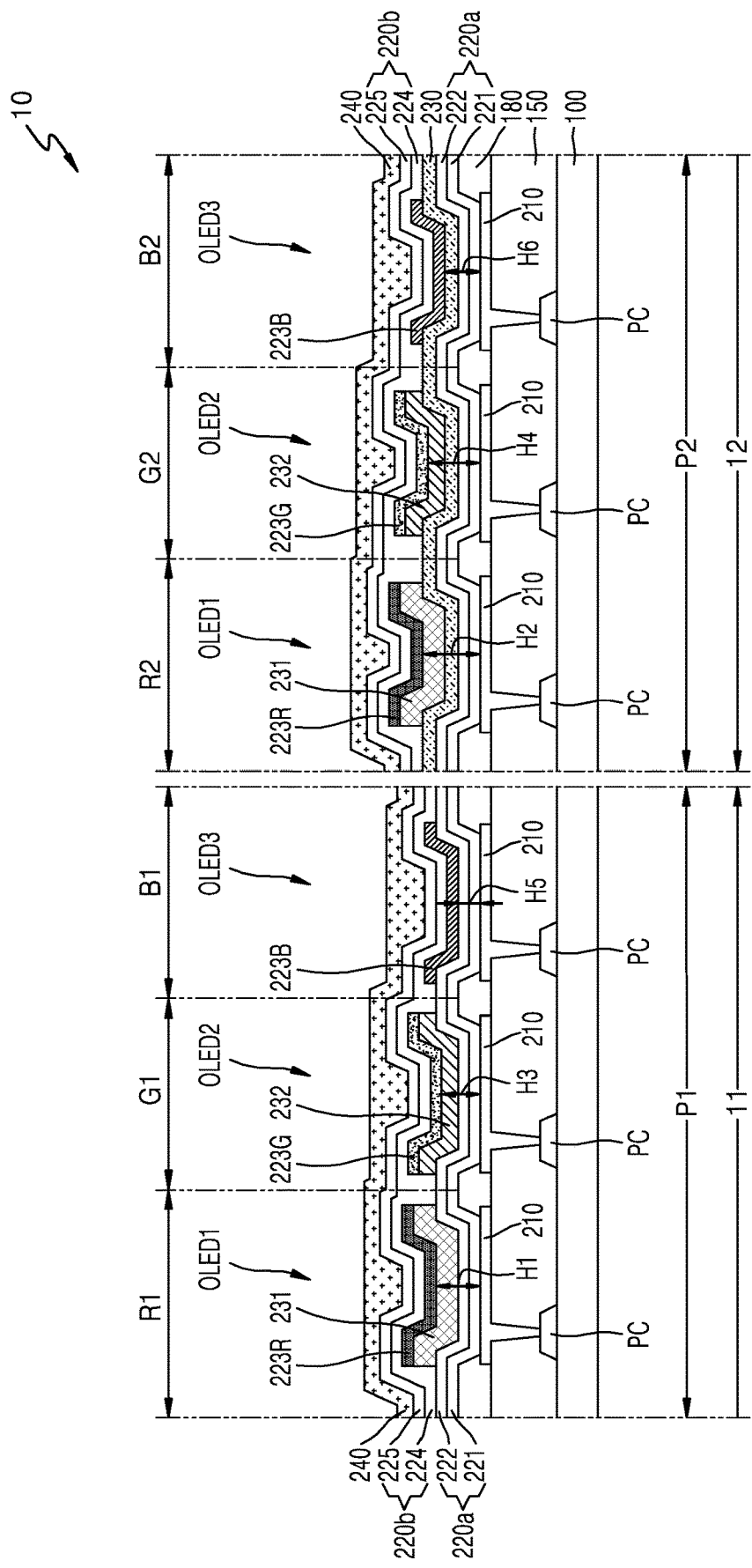
FIG. 2 is a schematic cross-sectional view of a first pixel and a second pixel of a display device included in the electrical device of FIG. 1.

However, according to an embodiment, one of the first screen 4A and the second screen 4B of the display device 10 may further include an optical resonance layer 230 (shown, for example, in FIG. 2). Accordingly, the difference in color coordinates of light emitted from the first screen 4A and the second screen 4B may be minimized or reduced, and the user 2 may recognize substantially the same color regardless of whether the light perceived by the user 2 is emitted at the first screen 4A or the second screen 4B.

FIG. 2 is a schematic cross-sectional view of one of the plurality of first pixels P1 and one of the plurality of second pixels P2 of the display device 10 of FIG. 1. In FIG. 2, the display device 10 is illustrated without including the transparent protective substrate 12 for convenience of explanation.

Referring to FIG. 2, the display device 10 includes a substrate 100 on which the first pixel P1 and the second pixel P2 are formed. The substrate 100 is bent according to a shape of the display device 10. For example, the substrate 100 includes a first region 11 and a second region 12, which are bent against each other, and the first region 11 of the substrate 100 corresponds to the first screen 4A of the display device 10 and the second region 12 corresponds to the second screen 4B of the display device 10.

The first pixel P1 is formed on the first region 11 of the substrate 100, and the second pixel P2 is formed on the second region 12 of the substrate 100. Here, each of the first pixel P1 and the second pixel P2 may include sub-pixels R1 R2, G1 G2, and B1 B2 that produce different colors from each other. For example, each of the first pixel P1 and the second pixel P2 may include the sub-pixels R1 R2, G1 G2, and B1 B2 that each emit red light, green light, and blue light, respectively, wherein each of the sub-pixels R1 R2, G1

G2, and B1 B2 may include light-emitting diodes, such as organic light-emitting diodes OLED 1, OLED 2, and OLED 3. An example embodiment of the present inventive concept describes that each of the first pixel P1 and the second pixel P2 includes the red, green, and blue sub-pixels R1 R2, G1 G2, and B1 B2, but the example embodiments of the present invention are not limited thereto. In the case of a display device capable of producing full-color, a combination of different colors other than a combination of red, green, and blue may be available. That is, when a display device is capable of producing full-color, the display device may be configured in various modifications in addition to the combination of the three color sub-pixels R1 R2, G1 G2, and B1 B2 as described in the example embodiment above. For example, a combination of four sub-pixels of blue, green, red, and white may be available.

The substrate 100 may be formed of a metal material or a plastic material, such as polyethylen terephthalate (PET), polyethylen naphthalate (PEN), polyimide, or the like. When the substrate 100 is formed of such a plastic or metal material, the substrate 100 may have flexibility. To prevent penetration of impurities or contaminants, the substrate 100 may include a buffer layer that is formed of $SiO_2$ and/or SiNx.

A pixel circuit (PC) may be formed, on the substrate 100, for each of the sub-pixels R1 R2, G1 G2, and B1 B2. The PC may include a thin film transistor and a capacitor, and may be covered by an insulating layer 150 of which a top surface is approximately flat.

A pixel electrode 210 is formed in an island shape or configuration as being patterned in correspondence to each of the sub-pixels R1 R2, G1 G2, and B1 B2. The pixel electrode 210 may be formed as a reflective electrode or a (semi)transparent electrode. When the pixel electrode 210 is formed as a reflective electrode, silver (Ag), magnesium (Mg), aluminum (Al), platinum (Pt), palladium (Pd), gold (Au), nickel (Ni), neodymium (Nd), iridium (Ir), chromium (Cr), or a compound thereof may be used to form a reflective layer to which a layer formed of indium tin oxide (ITO), indium zinc oxide (IZO), zinc oxide (ZnO), indium oxide ($In_2O_3$), indium gallium oxide (IGO) or aluminum zinc oxide (AZO) may be formed. When the pixel electrode 210 is formed as a (semi)transparent electrode, the (semi)transparent electrode may be formed of ITO, IZO, ZnO, IGO, or AZO.

A pixel-defining film 180 may include an opening in correspondence to the sub-pixels R1 R2, G1 G2, and B1 B2, and may expose a top surface of the pixel electrode 210 through the opening. The pixel-defining film 180 may also cover an edge of the pixel electrode 210. The pixel-defining film 180 may include an organic insulating layer, such as an acryl resin. The pixel-defining film 180 increases a distance between one end of the pixel electrode 210 and a counter electrode 240, thereby preventing or reducing the occurrence of arc or the like at one end of the pixel electrode 210.

The sub-pixels R1 R2, G1 G2, and B1 B2 include emission layers 223R, 223G, and 223B, respectively. The red sub-pixel R1 of the first pixel P1 and the red sub-pixel R2 of the second pixel P2 may each include a red emission layer 223R. For example, the red emission layer 223R may include, as a host, an anthracene-based derivative, a carbazole-based compound, or the like, and may include, as a dopant, a phosphorescent material including at least one selected from the group consisting of PIQIr (acac)(bis(1-phenylisoquinoline)acetylacetonate iridium), PQIr (acac(bis (1-phenylquinoline)acetylacetonate iridium), PQIr (tris(1-phenylquinoline) iridium), and PtPEP (octaethylporphyrin platinum). In another example embodiment, the red emission layer 223R may include a fluorescent material, such as PED:Eu(DBM)3(Phen) or Perylene, but is not limited thereto.

The green sub-pixel G1 of the first pixel P1 and the green sub-pixel R2 of the second pixel P2 may include each a green emission layer 223G. For example, the green emission layer 223G may include, as a host, an anthracene-based derivative, a carbazole-based compound, or the like, and may include, as a dopant, Ir(ppy)3 (fac tris(2-phenylpyridine) iridium). In another example embodiment, the green emission layer 223G may include a fluorescent material, such as $Alq_3$ (tris(8-hydroxyquinoline) aluminum), but is not limited thereto.

The blue sub-pixel B1 of the first pixel P1 and the blue sub-pixel B2 of the second pixel P2 may each include a blue emission layer 223B. For example, the blue emission layer 223B may include, as a host, an anthracene-based derivative, a carbazole-based compound, or the like, and may include, as a dopant, $F_2$Irpic, $(F2ppy)_2$Ir(tmd) or Ir(dfppz)$_3$. In another example embodiment, the blue emission layer 223B may include a fluorescent material including at least one selected from the group consisting of DPVBi, spiro-DPVBi, spiro-6P, distilled benzene (DSB), distilled arylene (DSA), a PFO-based polymer, and a PPV-based polymer, but is not limited thereto.

At least one functional layer of a first functional layer 220a and a second functional layer 220b may be further formed on and/or underneath the red, green, and blue emission layers 223R, 223G, and 223B that are each formed on the red, green, and blue sub-pixels R1 R2, G1 G2, and B1 B2.

The first functional layer 220a is arranged or formed adjacent to the pixel electrode 210, and may be formed as one body to cover the first region 11 and the second region 12 of the substrate 100. The first functional layer 220a may include a hole transport layer (HTL) 222 and a hole injection layer (HIL) 221, and may have a single-layer structure or a multi-layer structure. For example, when the first functional layer 220a is formed of a high-molecular weight material, the first functional layer 220a may serve as the HTL 222 and include poly-(3,4)-ethylene-dihydroxy thiophene (PEDOT) or polyaniline (PANI). When the first functional layer 220a is formed of a low-molecular weight material, the first functional layer 220a may include both the HIL 221 and the HTL 222.

The second functional layer 220b may be arranged or formed over each of the emission layers 223R, 223G, and 223B, and may be formed as one body to cover the first region 11 and the second region 12 of the substrate 100. The second functional layer 220b may include an electron transport layer (ETL) 224 and an electron injection layer (EIL) 225. The formation of the second functional layer 220b may be omitted in some example embodiments. For example, when the first functional layer 220a and the emission layers 223R, 223G, and 223B are formed of a high-molecular weight material, the second functional layer 220b may be omitted. When the first functional layer 220a and the emission layers 223R, 223G, and 223B are formed of a low-molecular weight material, the second functional layer 220b may be formed to enhance light-emitting characteristics.

The optical resonance layer 230 is formed on the second region 12 among the first region 11 and the second region 12 of the substrate 100. As the optical resonance layer 230 is formed only on the second region 12 of the substrate 100, the difference in the color characteristics caused by the bending between the first screen 4A and the second screen 4B may be improved as described above.

The optical resonance layer 230 is positioned between the pixel electrode 210 and the counter electrode 240, and may be formed on the second region 12 only among the first region 11 and the second region 12 of the substrate 100. In one embodiment, the optical resonance layer 230 may be formed between the pixel electrode 210 and the emission layers 223R, 223G, and 223B of the second region 12 of the substrate 100. A height from the pixel electrode 210 to each of the emission layers 223R, 223G, and 223B of the sub-pixels R1, G1, and B1 of the first pixel P1 is different from a height from the pixel electrode 210 to each of the emission layers 223R, 223G, and 223B of the sub-pixels R2, G2, and B2 of the second pixel P2.

In an example embodiment, a first height H1 from the pixel electrode 210 of the red sub-pixel R1 of the first pixel P1 to the red emission layer 223R may be smaller than a second height from the pixel electrode 210 of the red sub-pixel R2 of the second pixel P2 to the red emission layer 223R. In another example embodiment, a third height H3 from the pixel electrode 210 of the green sub-pixel G1 of the first pixel P1 to the green emission layer 223G may be smaller than a fourth height H4 from the pixel electrode 210 of the green sub-pixel G2 of the second pixel P2 to the green emission layer 223G. Likewise, a fifth height from the pixel electrode 210 of the blue sub-pixel B1 of the first pixel P1 to the blue emission layer 223B may be smaller than a sixth height measured from the pixel electrode 210 of the blue sub-pixel B2 of the second pixel P2 to the blue emission layer 223B. A difference between the first height H1 and the second height H2, a difference between the third height H3 and the fourth height H4, and/or a difference between the fifth height H5 and a sixth height H6 may be substantially the same as a thickness of the optical resonance layer 230.

FIG. 2 illustrates an example embodiment that the optical resonance layer 230 is located underneath each of the emission layers 223R, 223G, and 223B of each of the sub-pixels R2, G2, and B2 of the second region 12 of the substrate 100, but the example embodiment is not limited thereto. In another example embodiment, the optical resonance layer 230 may be arranged over each of the emission 223R, 223G, and 223B of each of the sub-pixels R2, G2, and B2 of the second region 12 of the substrate 100.

The optical resonance layer 230 may perform a role of at least one of a HIL, a HTL, an ETL, and an EIL. In an example embodiment, the optical resonance layer 230 may be formed of a hole transport material, and accordingly, may perform a role of the HTL. The hole transport material may be, for example, a carbazole-based derivatice, such as N-phenylcarbazole or polyvinylcarbazole, a triphenylamin-based material, such as N,N'-bis(3-methylphenyl)-N,N'-diphenyl-[1,1-biphenyl]-4,4'-diamine (TPD), N,N'-di(1-naphthyl)-N,N'-diphenylbenzidine (NPB), or 4,4',4"-tris(N-carbazolyl)triphenylamine (TCTA), but is not limited thereto.

In another example embodiment, the optical resonance layer 230 may be formed of a hole injection material, and accordingly, may perform a role of the HIL. The hole injection material may be, for example, a phthalocyanine compound, such as copper phthalocyanine, or N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2T-NATA), N,N'-di(-naphthyl)-N,N'-diphenylbenzidine (NPB), poly(3, 4-ethylenedioxythiophene)/poly(4-styrenesulfonate) (PE-DOT/PSS), polyaniline/dodecylbenzenesulfonic acid (Pani/DBSA), polyaniline/camphor sulfonic acid (Pani/CSA), or polyaniline/poly(4-styrenesulfonate) (PANI/PSS), but is not limited thereto.

In another example embodiment, the optical resonance layer 230 may be formed of an electron injection material, and accordingly, may perform a role of the EIL. The electron injection material may be, for example, LiF, NaCl, CsF, Li2O, or BaO, but is not limited thereto In another example embodiment, the optical resonance layer 230 may be formed of an electron transport material, and accordingly, may perform a role of the HTL. The electron transport material may be, for example, $Alq_3$, 2,9-dimethyl-4,7-diphenyl-1,10-phenanthroline (BCP), 4,7-diphenyl-1,10-phenanthroline (Bphen), 3-(4-Biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) ($Bebq_2$), 9,10-di(naphthalene-2-yl)anthrascene (AND), or the like, but is not limited thereto.

Among the sub-pixels R1, G1, B1, R2, G2, and B2 that are formed over the first pixel P1 and the second pixel P2, the sub-pixels R1 R2, G1 G2, and B1 B2 that produce at least one color may further include a resonance auxiliary layer. The optical resonance layer 230 is configured to reduce the color deviation in accordance with the arrangement of the first screen 4A and the second screen 4B, whereas a first resonance auxiliary layer 231 and a second resonance auxiliary layer 232 are configured to improve light-emitting efficiency of a particular color.

In a non-limiting example embodiment, the red sub-pixels R1 and R2 may each further include the first resonance auxiliary layer 231 that is formed underneath the red emission layer 223R, so as to improve light-emitting efficiency of red light, and the green sub-pixels G1 and G2 may each further include the second resonance auxiliary layer 232 that is formed underneath the green emission layer 223G, so as to improve light-emitting efficiency of green light. The first resonance auxiliary layer 231 and the second resonance auxiliary layer 232 may be each independently used to amplify light having a different wavelength, and thus a thickness of each of the first resonance auxiliary layer 231 and the second resonance auxiliary layer 232 may be different from each other.

The counter electrode 240 may be integrally formed as one body corresponding to the first electrode P1 and the second electrode P2, so as to cover the first region 11 and the second region 12 of the substrate 100. The counter electrode 240 may be formed as a (semi)transparent electrode or a reflective electrode. When the counter electrode 240 is formed as a (semi)transparent electrode, a layer formed of Li, Ca, LiF/Ca, LiF/AI, Al, Mg, or a combination thereof is formed, and then, a layer formed of a (semi)transparent material, such as ITO, IZO, ZnO, or $In_2O_3$, is formed thereon, thereby forming a (semi)transparent electrode. When the counter electrode 240 is formed as a reflective electrode, a layer including at least one material selected from, e.g., Li, Ca, LiF/Ca, LiF/AI, Al, Ag, and Mg may be formed, thereby forming a reflective electrode. Although not shown, a protective layer may be further formed on the counter electrode 240.

Figure 3:
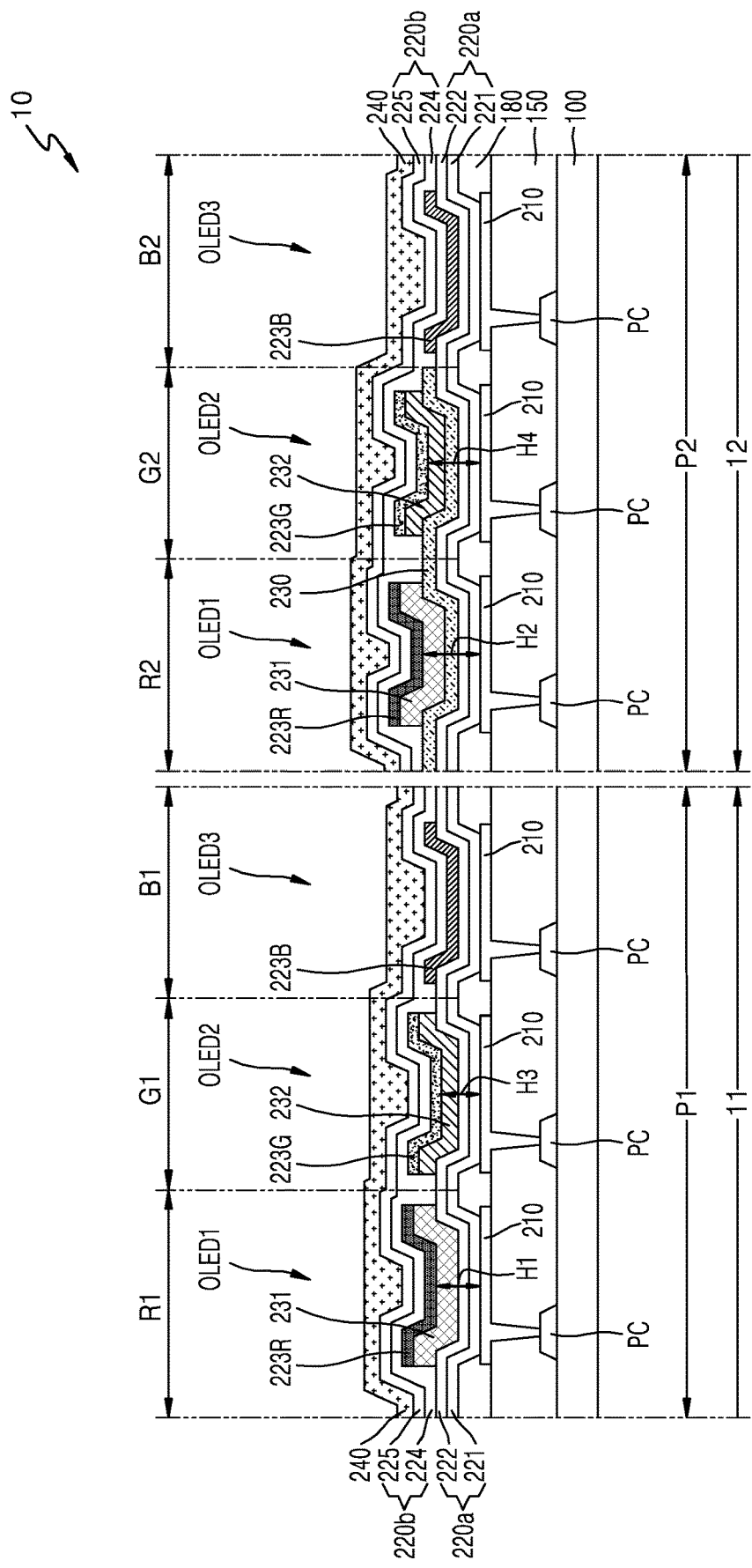
FIGS. 3 and 4 are each a schematic cross-sectional view of a display device according to another example embodiment.
Figure 4:
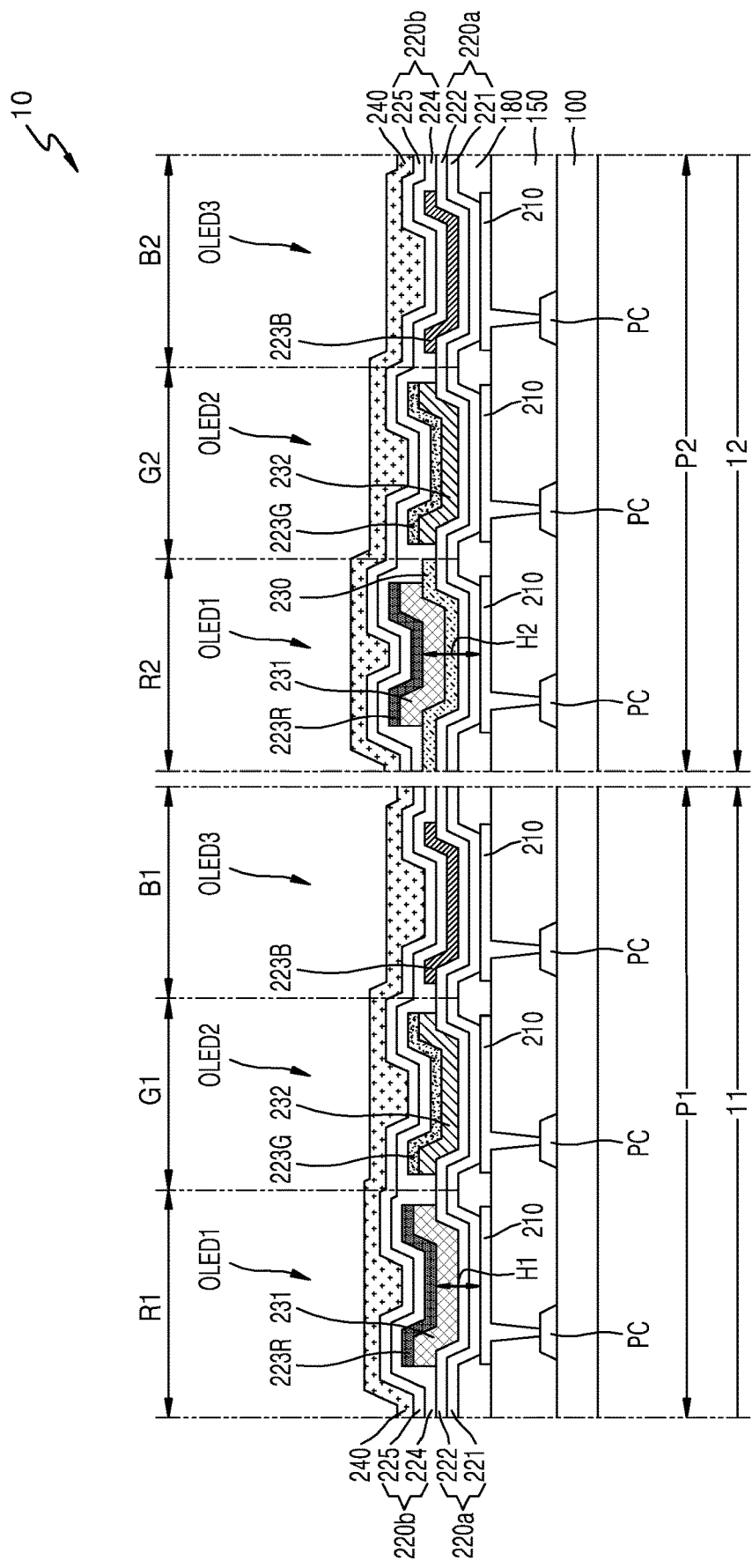

FIGS. 3 and 4 are each a schematic cross-sectional view of a display device according to another example embodiment.

The optical resonance layer 230 is formed on the second region 12 only among the first region 11 and the second region 12 of the substrate 100. As shown in FIG. 2, the optical resonance layer 230 may be formed to correspond to the red, green, and blue sub-pixels R2, G2, and B2 that constitute the second pixel P2 on the second region 12.

In another example embodiment, referring to FIG. 3, the optical resonance layer 230 may be formed on the second region 12 only of the substrate 100, but may correspond to only two sub-pixels, e.g., the red and green sub-pixels R2 and G2, among the red, green, and blue sub-pixels R2, G2, and B2 that constitute the second pixel P2.

In another example embodiment, referring to FIG. 4, the optical resonance layer 230 may be formed on the second region 12 only of the substrate 100, but may correspond to only 1 sub-pixel, e.g., the red sub-pixel R2, among the red, green, and blue sub-pixels R2, G2, and B2 that constitute the second pixel P2.

FIGS. 5 to 8 are cross-sectional views for describing a method of manufacturing the display device, according to an example embodiment.

Figure 5:
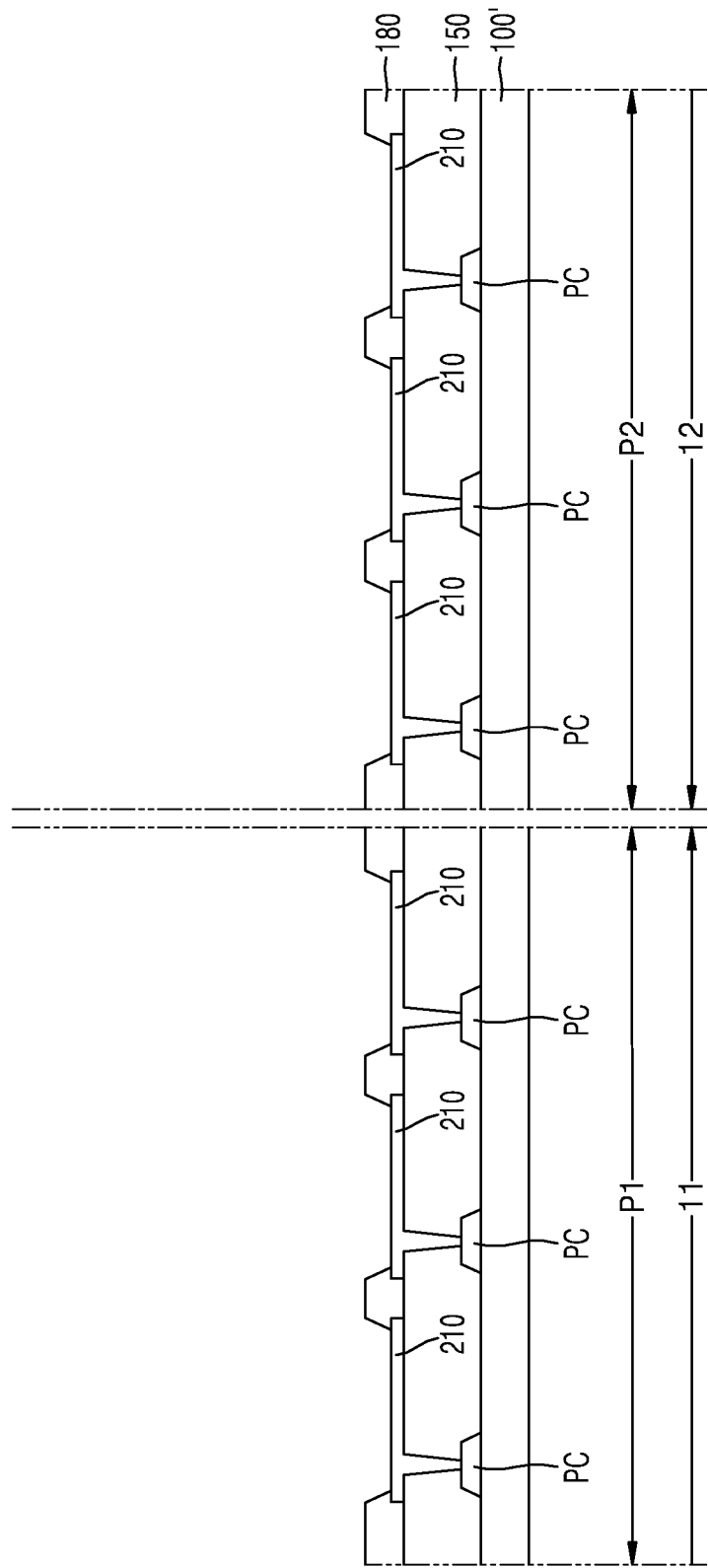
FIGS. 5 to 8 are cross-sectional views for describing a method of manufacturing a display device, according to an example embodiment.

Referring to FIG. 5, a substrate 100' including the first region 11 and the second region 12 is prepared. Here, the substrate 100' is a flat substrate in which the first region 11 and the second region 12 are not bent with respect to each other. The substrate 100' may be formed of a metal material or a plastic material as described above.

A buffer layer that prevents or reduces penetration of impurities or contaminants may be formed on the substrate 100', and a pixel-circuit (PC) including a thin film transistor and a capacitor may be formed on the buffer layer. The PC is formed for each of the sub-pixels R1, G1, B1, R2, G2, and B2, and may be covered by an insulating layer 150 of which a top surface is approximately flat.

Afterwards, the pixel electrode 210 is formed on the insulating layer 150, and the pixel-defining film 180 exposing a top surface of the pixel electrode 210 is formed of the pixel electrode 210. The pixel electrode 210 is formed for each of the sub-pixels R1 R2, G1 G2, and B1 B2, and may be formed as a (semi)transparent electrode or a reflective electrode. Materials for forming the pixel electrode 210 and the pixel-defining film 180 are the same with those described above in connection with FIG. 2.

Figure 6:
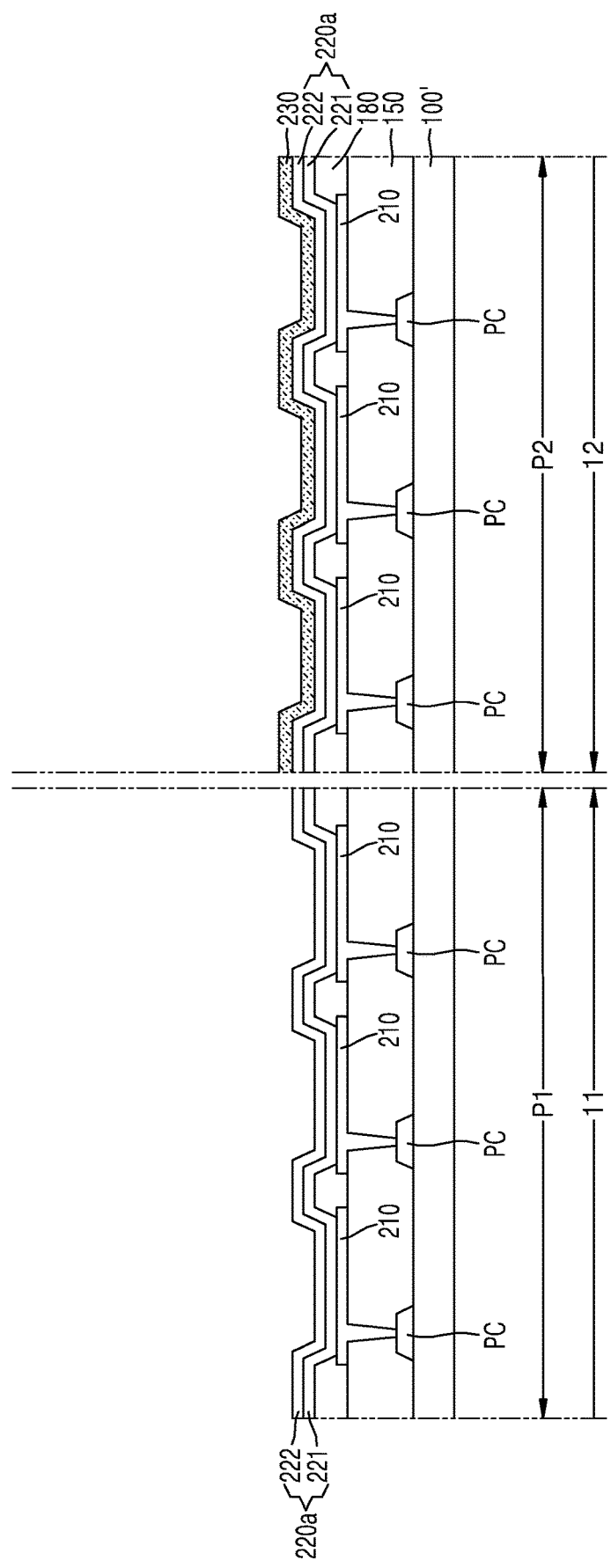

Referring to FIG. 6, the first functional layer 220a may be formed on the substrate 100'. The first functional layer 220a may be formed as one body to cover the first region 11 and the second region 12 of the substrate 100'. The first functional layer 220a may include the HTL 222 and the HIL 221, and may have a single-layer structure or a multi-layer structure. Materials for forming the first functional layer 220a are the same with those described above in connection with FIG. 2.

Afterwards, the optical resonance layer 230 is formed on the second region 12 among the first region 11 and the second region 12 of the substrate 100'. In some example embodiments, an optical resonance layer may be formed by a thermal evaporation method using a mask including an opening, which is arranged in correspondence to the second region 12 of the substrate 100'. Here, a case where the optical resonance layer 230 is formed by using the thermal evaporation method is described, but the present invention is not limited thereto.

The optical resonance layer 230 may include, for example, at least one selected from a hole injection material, a hole transport material, an electron injection material, and an electron transport material, and may have a single-layer structure or a multi-layer structure. The optical resonance layer 230 may have a thickness in a range of 80 Å to 210 Å (or about 80 Å to about 210 Å).

FIG. 6 illustrates a case where the optical resonance layer 230 is formed to correspond to all of the sub-pixels R2, G2, and B2 of the second pixel P2, but the present invention is not limited thereto. As described in connection with FIGS. 3 and 4, the optical resonance layer 230 may be formed to correspond to at least one sub-pixel of the plurality of the sub-pixels R2, G2, and B2 of the second pixel P2.

Figure 7:
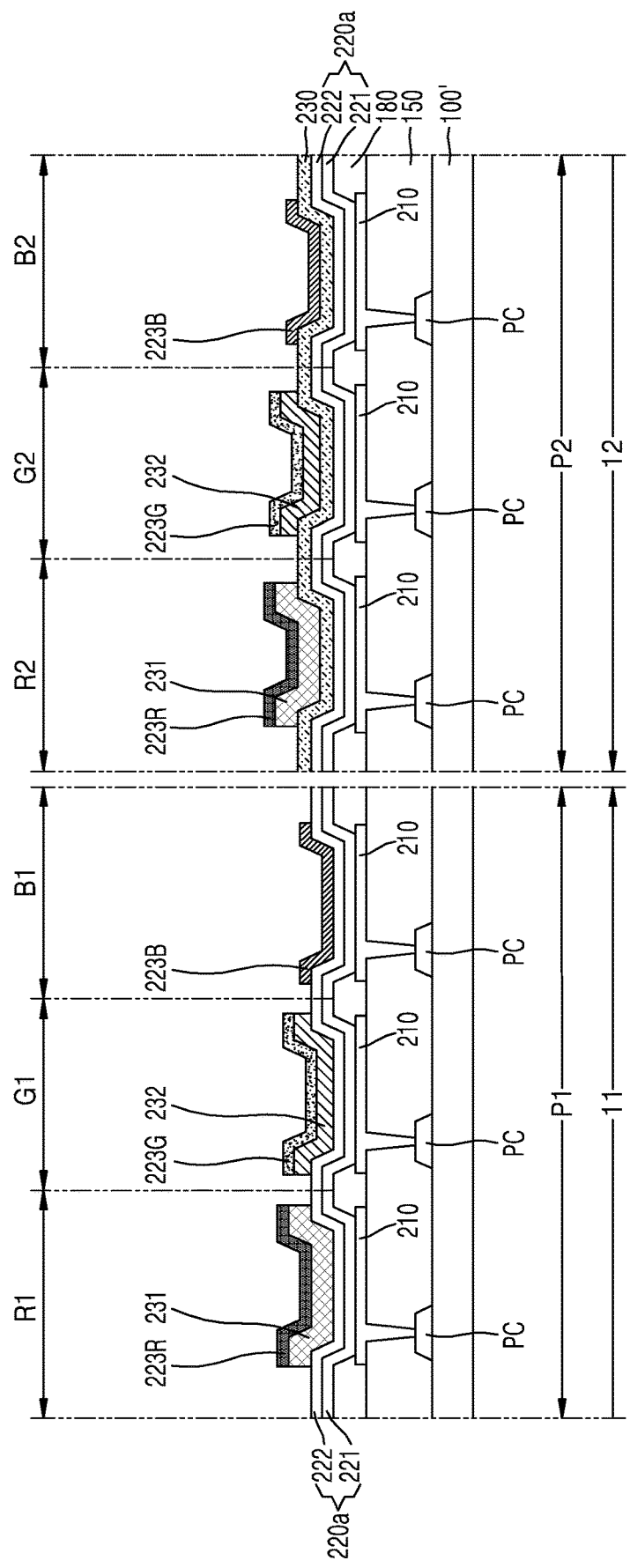

Referring to FIG. 7, the emission layers 223R, 223G, and 223B are formed for each of the sub-pixels R1, G1, B1, R2, G2, and B2. On the first region 11 and the second region 12 of the substrate 100', the red emission layer 223R is formed on a region corresponding to the red sub-pixels R1 and R2, the green emission layer 223G is formed on a region corresponding to the green sub-pixels G1 and G2, and the blue emission layer 223B is formed on a region corresponding to the blue sub-pixels B1 and B2. The emission layers of the same color 223R, 223G, and 223B may be formed at the same time according to the same process for each of the sub-pixels R1, G1, B1, R2, G2, and B2. The red emission layer 223R, the green emission layer 223G, and the blue emission layer 223B may be formed of a phosphorescent material or a fluorescent material as described in connection with FIG. 2.

Before performing the process of forming the emission layers 223R, 223G, and 223B, a resonance auxiliary layer may be formed on a region corresponding to at least one of the sub-pixels R1, G1, B1, R2, G2, and B2. For example, before performing the process of forming the red emission layer 223R, a first resonance auxiliary layer 231 may be formed, and before performing the process of forming the green emission layer 223G, a second resonance auxiliary layer 232 may be formed. For example, the first resonance auxiliary layer 231 and the second resonance auxiliary layer 232 may include at least one of a hole injection material, a hole transport material, an electron injection material, and an electron transport material.

Figure 8:
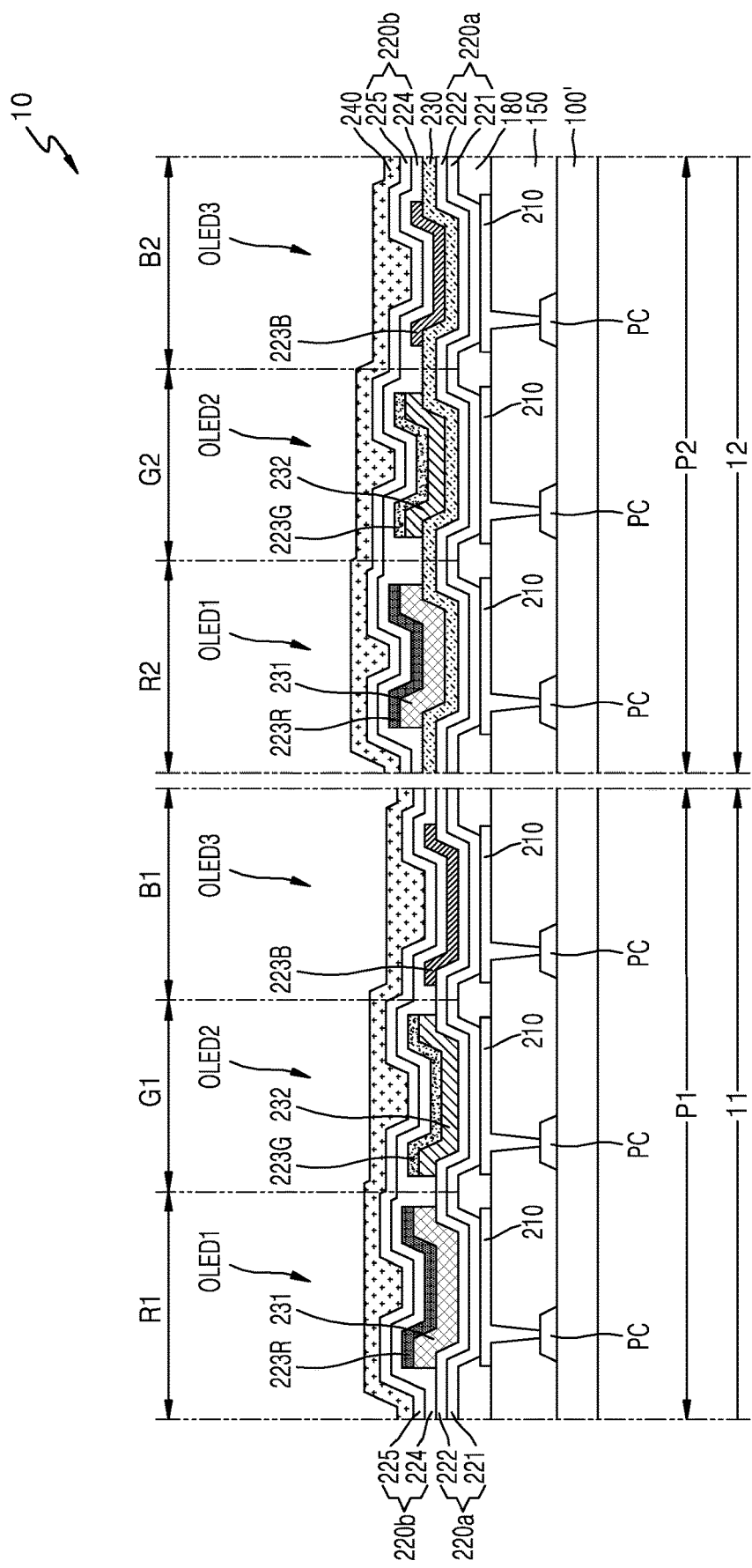

Referring to FIG. 8, the second functional layer 220b and the counter electrode 240 are formed on the substrate 100'. The second functional layer 220b may be formed as one body to cover the first region 11 and the second region 12 of the substrate 100'. The second functional layer 220b may include the EIL 225 and the ETL 224, and materials for forming the second functional layer 220b are the same with those described above in connection with FIG. 2. In a non-limiting example embodiment, the second functional layer 220b may be omitted.

The counter electrode 240 may be formed as one body to cover the first region 11 and the second region 12 of the substrate 100'. The counter electrode 240 may be formed as a (semi)transparent electrode or a reflective electrode, and materials for forming the counter electrode 240 are the same with those described above in connection with FIG. 2.

Afterwards, the substrate 100' is subjected to bending to have a shape as shown in FIG. 1, and that is, the first region 11 and the second region 12 are arranged on both (e.g., opposing) sides of the folding portion L (see FIG. 1).

A display device 10 includes the optical resonance layer 230 on the second region 12, and thus may improve the difference in the color coordinates caused by the bending between the first screen 4A formed in correspondence to the first region 11 of the substrate 100 and the second screen 4B formed in correspondence to the second region 12 of the substrate 100.

Table 1 below shows color coordinates of a first screen 4A and a second screen 4B of a display device 10 in which an optical resonance layer 230 is not formed, whereas Table 2 below shows color coordinates of the first screen 4A and the second screen the display device 10 in which the optical resonance layer 230 is formed on the second region 12 of the substrate 100 according to the example embodiments of the present inventive concept. In Tables 1 and 2, θ denotes a minor angle between the first screen 4A and the second screen 4B (see FIG. 1), x and y each denote an x-axis value and an y-axis value of the color-coordinate graph, and R, G, and B each denote red light, green light, and blue light.

TABLE 1

| | | Second screen | | | | | | |
|---|---|---|---|---|---|---|---|---|
| First screen | | θ = 120° | | θ = 135° | | θ = 150° | | |
| x | y | x | y | x | y | x | y | |
| R | 0.677 | 0.323 | 0.664 | 0.336 | 0.655 | 0.344 | 0.654 | 0.346 |
| G | 0.270 | 0.695 | 0.219 | 0.717 | 0.197 | 0.703 | 0.205 | 0.689 |
| B | 0.139 | 0.046 | 0.146 | 0.035 | 0.149 | 0.032 | 0.148 | 0.034 |

TABLE 2

| | | Second screen | | | | | | |
|---|---|---|---|---|---|---|---|---|
| First screen | | θ = 120° | | θ = 135° | | θ = 150° | | |
| x | y | x | y | x | y | x | y | |
| R | 0.677 | 0.323 | 0.674 | 0.326 | 0.669 | 0.330 | 0.666 | 0.333 |
| G | 0.270 | 0.695 | 0.267 | 0.695 | 0.262 | 0.695 | 0.252 | 0.687 |
| B | 0.139 | 0.046 | 0.138 | 0.050 | 0.138 | 0.052 | 0.141 | 0.050 |

Referring to Table 1 above, in the case of the display device 10 in which the optical resonance layer 23 is not formed, the difference in the color coordinates of the first screen 4A and the second screen 4B is about 0.072 in maximum according to the angle between the first screen 4A and the second screen 4B. However, referring to Table 2 above, in the case of the display device 10 in which the optical resonance layer 23 is formed, the difference in the color coordinates of the first screen 4A and the second screen 4B is decreased to about 0.011 in maximum even in consideration of the angle between the first screen 4A and the second screen 4B.

In some example embodiments, FIG. 1 illustrates an example embodiment of the display device 10 that is bent such that a first distance L1 between a user 2 and an image provided through the first screen 4A is smaller than a second distance L2 a user 2 and an image provided through the second screen 4B, but the example embodiment is not limited thereto.

Figure 9:
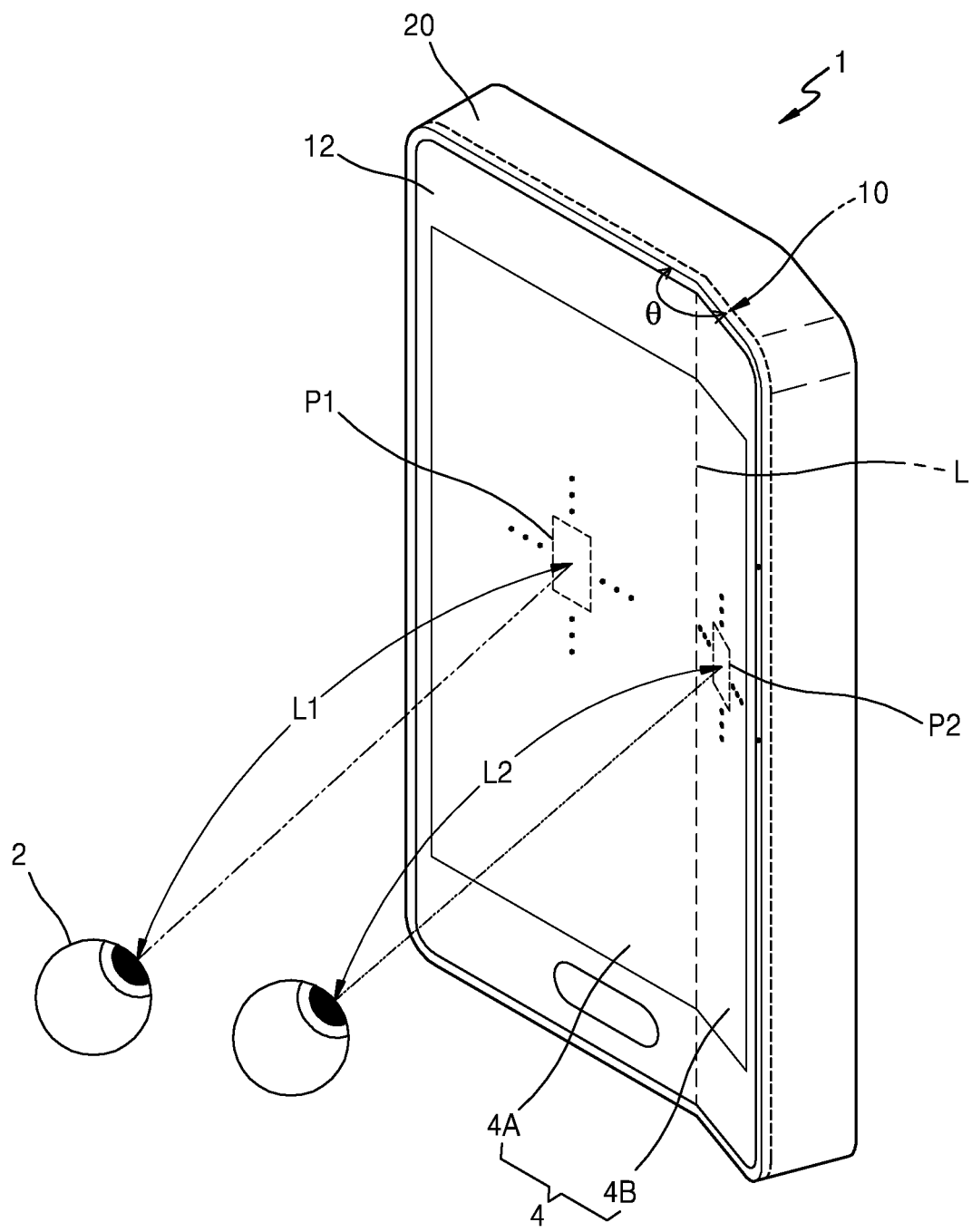
FIG. 9 is a schematic perspective view of an electrical device according to another example embodiment.

In some other example embodiments, FIG. 9 illustrates an example embodiment of the display device 10 that is bent to have an obtuse minor angle θ between the first screen 4A and the second screen 4B such that a first distance L1 between a user 2 and an image provided through the first screen 4A is greater than a second distance L2 a user 2 and an image provided through the second screen 4B. The display device 10 included in electronic equipment 1 of FIG. 9 may have a structure as described be referring to FIG. 1. Accordingly, the display device 10 may minimize the difference in the color coordinates of the first screen 4A and the second screen 4B, and may improve the efficiency of light emitted from the second screen 4B.

Figure 10A:
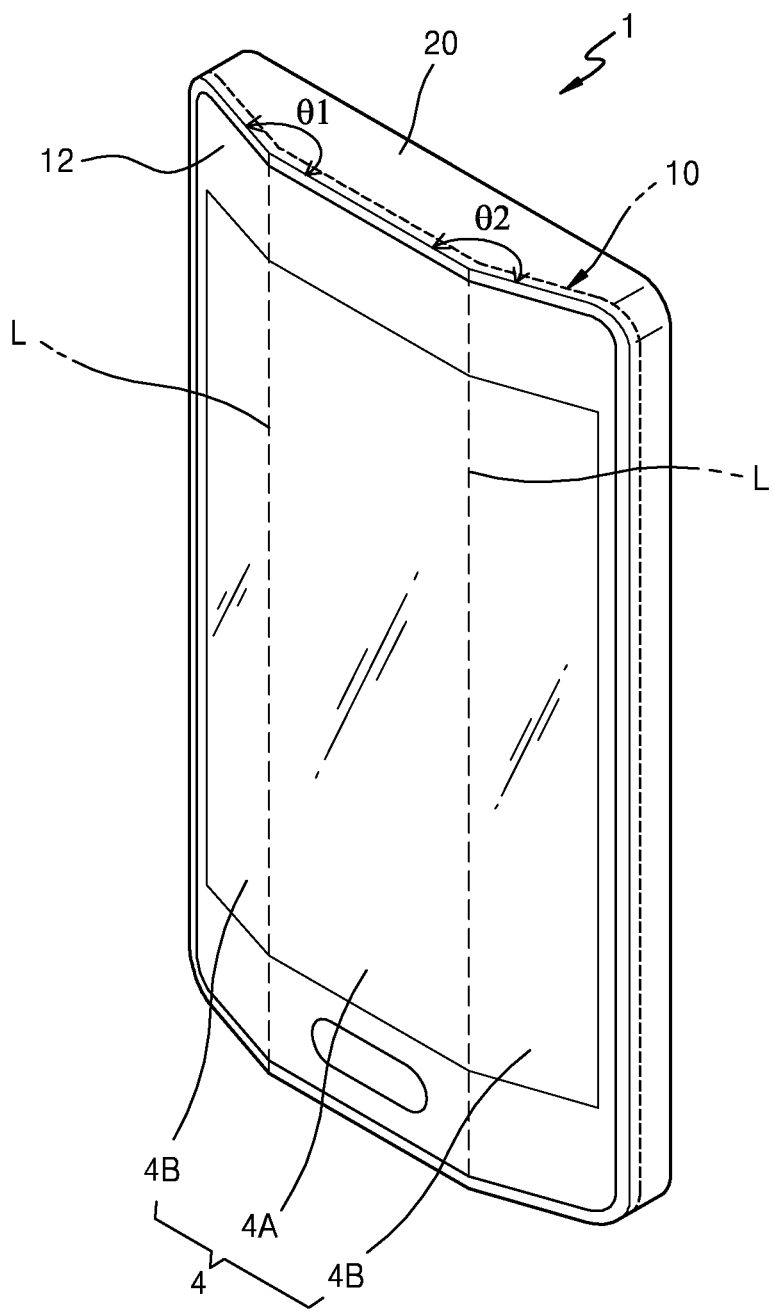
FIGS. 10a and 10b are each schematic perspective views of an electrical device according to another example embodiment.
Figure 10B:
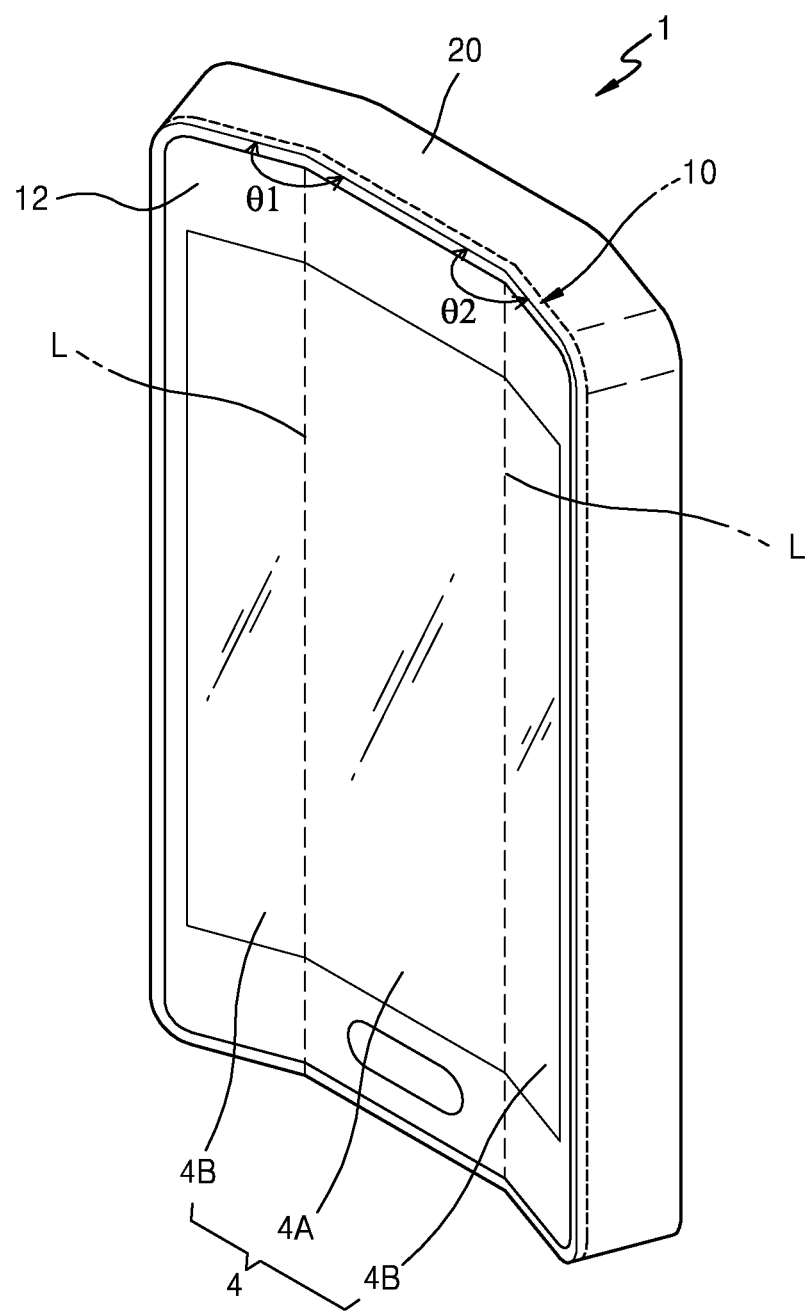

FIGS. 10A and 10B are each schematic perspective views of electronic equipment according to another example embodiment.

According to the example embodiments described above, the second screen 4B is positioned on one side of the first screen 4A, but the example embodiments are not limited thereto. In some example embodiments, as described in the FIGS. 10A and 10B, two second screens 4B may be formed both sides of the first screen 4A. The minor angles between the first screen 4A and the second screens 4B may be obtuse angles θ1 and θ2, and the obtuse angle θ1 and the obtuse angle θ2 may be different from each other.

According to the example embodiments described above, the second screens 4B are positioned on one side or both sides of the first screen 4A, but the example embodiments are not limited thereto.

The first screen 4A may have a polygonal shape having a plurality of edges, and the second screen 4B may be adjacent to at least one of the plurality of edges of the first screen 4A. The at least one of the plurality of edges of the first screen 4A may correspond to the folding portion L. For example, in a non-limiting example embodiment, when the first screen 4A is a quadrangle, the second screens 4B may be positioned on both sides, an upper side, and a lower side of the first screen 4A.

According to the example embodiments described above, the folding portion is formed as a line type, but the example embodiments are not limited thereto. In some example embodiments, the folding portion L may be a band type. When the folding portion L is a line type, the first and second screens 4A and 4B are sharply bent relative to each other. When the folding portion L is a band type, the first and second screens 4A and 4B are smoothly bent relative to each other to form a smooth curve.

As described above, according to the one or more of the above example embodiments, there are provided a display device having a bent screen with uniform color characteristics, and electronic equipment using the display device.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
 a substrate comprising a first region and a second region that are adjacent to each other, wherein the second region is bent relative to the first region;
 a plurality of first pixels in the first region;
 a plurality of second pixels in the second region; and
 a layer between a second pixel electrode and a second counter electrode opposite the second pixel electrode with respect to an emission layer in the second region, the layer not being present in the plurality of first pixels in the first region, such that a total number of layers between the second pixel electrode and the second counter electrode for a light-emitting diode (LED) of a first color is different than a total number of layers between a first pixel electrode and a first counter electrode that is opposite the first pixel electrode in the first region for a LED of the same first color, and
 wherein a distance between the second pixel electrode and the second counter electrode in the second region is greater than a distance between the first pixel electrode and the first counter electrode in the first region.

2. The display device of claim 1, wherein each of the plurality of first pixels and each of the plurality of second pixels comprise a red light-emitting diode (LED), a green LED, and a blue LED.

3. The display device of claim 2, wherein the layer in the second region corresponds to at least one of the red LED, the green LED, and the blue LED of the plurality of second pixels.

4. The display device of claim 2, wherein the layer comprises:
   a first portion between a pixel electrode and a counter electrode of a first LED from among the red, green, and blue LEDs, and
   a second portion between a pixel electrode and a counter electrode of a second LED from among the red, green, and blue LEDs,
   wherein the first portion and the second portion are integrally formed.

5. The display device of claim 4, wherein the layer further comprises a third portion between a pixel electrode and a counter electrode of a third LED from among the red, green, and blue LEDs, and
   wherein the first portion, the second portion, and the third portion are integrally formed.

6. The display device of claim 1, wherein the layer comprises a hole transport material, a hole injection material, an electron transport material, and/or an electron injection material.

7. The display device of claim 1, wherein an angle between the first region and the second region is an obtuse angle.

8. A display device comprising:
   a substrate comprising a first region and a second region bent relative to the first region;
   a plurality of first pixels in the first region, each of the first pixels comprising a first light-emitting diode (LED), the first LED comprising a pixel electrode, a counter electrode, and an emission layer for emitting light of a first color and being between the pixel electrode and the counter electrode;
   a plurality of second pixels in the second region, each of the second pixels comprising a second LED, the second LED comprising a pixel electrode, a counter electrode, and an emission layer configured to emit light of the first color and being between the pixel electrode and the counter electrode of the second LED; and
   a layer in only one region of the first region and the second region,
   wherein a first distance between the pixel electrode and the counter electrode of the first LED is different from a second distance between the pixel electrode and the counter electrode of the second LED, and
   wherein a total number of layers in the first LED is different from a total number of layers in the second LED.

9. The display device of claim 8, wherein the layer is located in the second region, and wherein a difference between the second distance and the first distance is equal to a thickness of the layer.

10. The display device of claim 8, wherein each of the first LED and the second LED further comprises a first auxiliary layer between the pixel electrode of a corresponding one of the first and second LEDs and the counter electrode of the corresponding one of the first and second LEDs.

11. The display device of claim 8, wherein each of the plurality of first pixels further comprises a third LED configured to emit light of a second color, each of the plurality of second pixels further comprises a fourth LED configured to emit light of the second color, and
    wherein each of the third and fourth LEDs comprises a pixel electrode, a counter electrode, and an emission layer configured to emit light of the second color and being between respective pixel electrode and respective counter electrode.

12. The display device as claimed in claim 11, wherein the layer is in the second region and corresponds to the second LED and the fourth LED, and wherein a third distance between the pixel electrode and the counter electrode of the third LED is less than a fourth distance between the pixel electrode and the counter electrode of the fourth LED.

13. The display device as claimed in claim 11, wherein the layer comprises a first portion that is between the pixel electrode and the counter electrode of the second LED and a second portion that is between the pixel electrode and the counter electrode of the fourth LED.

14. The display device as claimed in claim 13, wherein the first portion and the second portion are integrally formed.

15. The display device of claim 13, wherein each of the plurality of first pixels further comprises a fifth LED configured to emit light of a third color, each of the plurality of second pixels further comprises a sixth LED configured to emit light of the third color, and
    wherein each of the fifth and sixth LEDs comprises a pixel electrode, a counter electrode, and an emission layer configured to emit light of the third color and being between respective pixel electrode and respective counter electrode.

16. The display device of claim 15, wherein the layer further comprises a third portion that is between the pixel electrode and the counter electrode of the sixth LED, and
    wherein the first portion, the second portion, and the third portion of the layer are integrally formed.

17. The display device of claim 15, wherein a fifth distance between the pixel electrode and the counter electrode of the fifth LED is less than a sixth distance between the pixel electrode and the counter electrode of the sixth LED.

18. The display device of claim 15, wherein each of the fifth LED and the sixth LED further comprises a third auxiliary layer between the pixel electrode of a corresponding one of the fifth and the sixth LEDs and the counter electrode of the corresponding one of the fifth and sixth LEDs.

19. The display device of claim 11, wherein each of the third LED and the fourth LED further comprises a second auxiliary layer between the pixel electrode of a corresponding one of the third and the fourth LEDs and the counter electrode of the corresponding one of the third and fourth LEDs.

20. The display device of claim 8, wherein the layer comprises a hole transport material, a hole injection material, an electron transport material, and/or an electron injection material.

* * * * *